US005358411A

United States Patent [19]

Mroczkowski et al.

[11] Patent Number: 5,358,411

[45] Date of Patent: Oct. 25, 1994

[54] DUPLEX PLATED EPSILON COMPLIANT BEAM CONTACT AND INTERPOSER

[75] Inventors: Robert S. Mroczkowski, Landisville; Richard E. Rothenberger, Harrisburg, both of Pa.

[73] Assignee: The Whitaker Corporation, Wilmington, Del.

[21] Appl. No.: 103,613

[22] Filed: Aug. 9, 1993

[51] Int. Cl.[5] .................... H05K 1/00

[52] U.S. Cl. .................... 439/66; 439/751

[58] Field of Search .................... 439/65, 66, 88, 91, 439/861, 862, 751, 872

[56] References Cited

U.S. PATENT DOCUMENTS

| | | | |
|---|---|---|---|
| 4,699,593 | 10/1987 | Grabbe et al. | 439/71 |
| 4,927,369 | 5/1990 | Grabbe et al. | 439/66 |
| 5,181,852 | 1/1993 | Dambach et al. | 439/66 |
| 5,231,274 | 7/1993 | Reynier et al. | 439/886 |

OTHER PUBLICATIONS

"Electrical Connectors"; Filed Dec. 24, 1992; Robert S. Mroczkowski, et al., Inventors; U.S. Patent Office Ser. No. 07/996,751. *(Abstract and Drawings).

*Primary Examiner*—David L. Pirlot

[57] ABSTRACT

An electrical contact having a center leg and a pair of beams connected to the center leg. Each beam has a metal-coated end which may mate and unmate with electrical interfaces in a wiping movement. A plurality of electrical contacts are received in a plurality of spaced-apart retention openings in a contact module in a manner compatible with automatic insertion.

13 Claims, 6 Drawing Sheets

DUPLEX PLATED EPSILON COMPLIANT BEAM CONTACT AND INTERPOSER

FIELD OF INVENTION

The present invention relates to an electrical contact for mating and unmating with an electrical interface and more particularly to an electrical contact automatically insertable in a retention opening in a contact module, the electrical contact having plated contact ends which form an electrical circuit with the electrical interface.

BACKGROUND OF THE INVENTION

The means for interconnection of electronic components is an important consideration in the design of modern equipment. Some applications require sophisticated systems to permit data flow through the connector at high frequencies and at high speeds. Such connectors are disclosed in U.S. Pat. No. 4,699,593, Grabbe et al and U.S. Pat. No. 4,927,369, Grabbe et al and application Ser. No. 07/996,751 filed Dec. 24, 1992, Mroczkowski et al. In these documents, two electronic components such as two printed wiring boards are interconnected by a system of contacts, referred to as a land grid array. In this array, an interposer is sandwiched between the electronic components such that as the contact surfaces of the electronic components are moved towards one another, contact is made with the opposing surfaces of the interposer. The interposer, as disclosed in the known art, has contact elements in the form of loop-shaped contact springs in mirror image symmetry connected by a bight portion. The spring portions of the contact elements provide a contact force at the interface between the interposer and the electronic component. The configuration of the contact spring and the interposer module has necessitated that the interposer be hand assembled which has resulted in a device which cannot be produced rapidly or economically.

The applicants have recognized that there is a need for an interposer which can be assembled by automated means and which can withstand multiple mating/unmating cycles for use with different devices or for reuse in the same device.

SUMMARY OF THE INVENTION

The present invention provides an electrical contact for mating and unmating with an electrical interface which can be assembled by automated means.

In accordance with the teachings of the present invention, there is disclosed herein an electrical contact in combination with a contact module for mating/unmating with electrical interface. The electrical contact includes an electrical contact unit having a center leg, a first beam and a second beam. The beams are connected to the center leg. Each beam has an end distal from the center leg wherein electrical contact with respective electrical interfaces is made at the ends of the respective beam. The electrical contact unit is formed of a material which resists plastic deformation wherein said unit may withstand hundreds of mating/unmating cycles. The contact module has a top, a bottom, a first side and a second side. A plurality of spaced-apart retention openings are formed in each side. The center leg of the electrical contact unit is slidingly received in the retention opening and is retained therein by an interference fit. The end of the first beam of the electrical contact unit is disposed on the top of the contact module and the end of the second beam of the electrical contact unit is disposed on the bottom of the contact module. In this manner, lateral and vertical movement of the beams is restricted. Receipt of the electrical contact unit in the module is compatible with automatic insertion. The respective beams have a resiliency wherein, when the electrical contact mates/unmates with the electrical interface, a wiping movement is produced to provide an effective electrical connection. The end of the first beam has a gold coating thereon and the end of the second beam has a tin alloy coating thereon for contact with the electrical interface.

These and other objects of the present invention will become apparent from a reading of the following specification, taken in conjunction with the enclosed drawings.

DETAILED DESCRIPTION OF THE PREFERRED EMBODIMENTS

Figure 1:
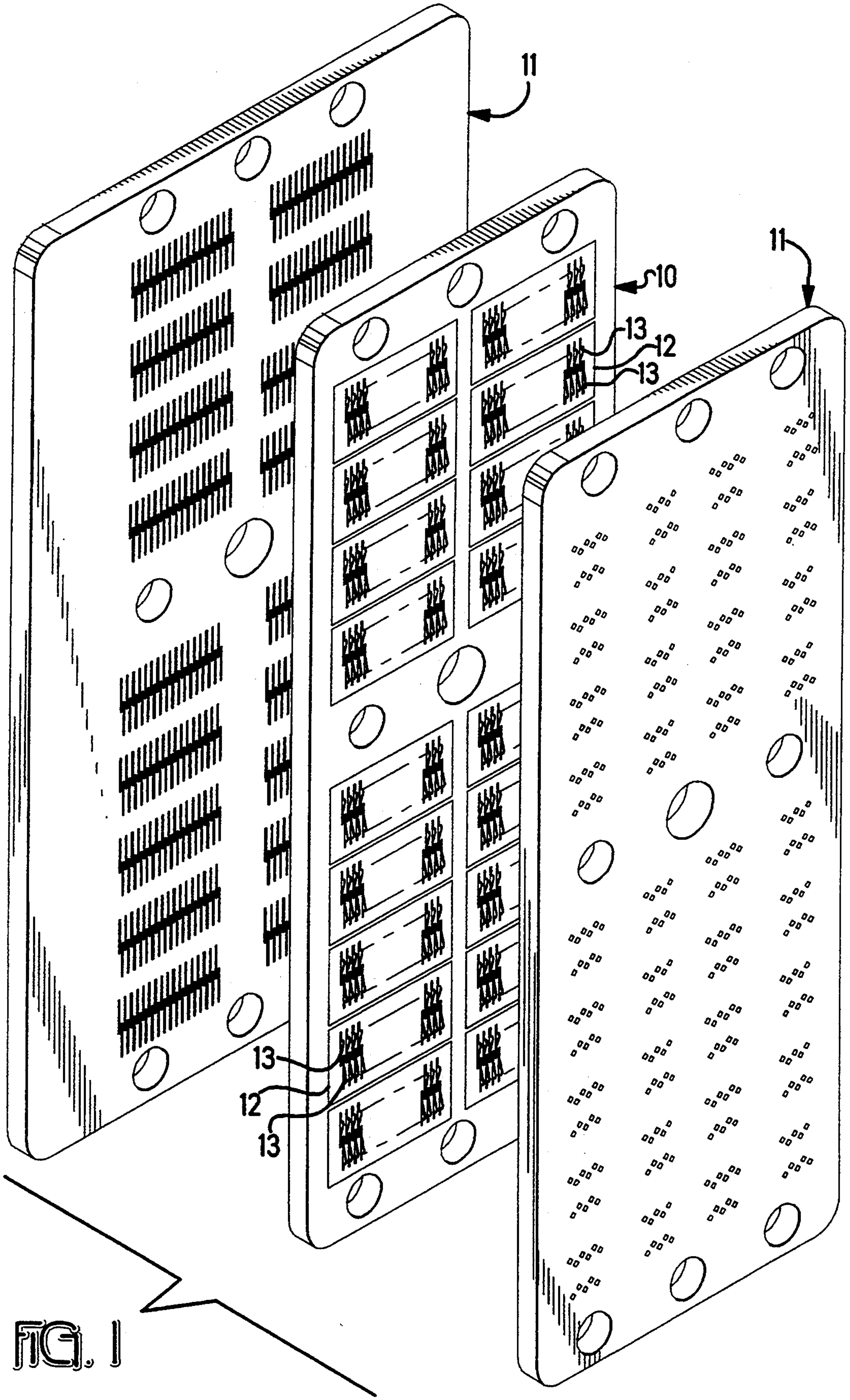
FIG. 1 is an exploded perspective view of an interposer of the present invention disposed between two electrical interfaces.

Referring now to FIGS. 1-9, in a typical land grid array, an interposer 10 is disposed between electrical interfaces 11 such as printed wiring boards or similar circuitry having pads for making electrical contact. The electrical interface 11 and the interposer 10 are fixtured so as to be registered with one another so that the pads on the electrical interface 11 are positioned to mate with electrical contact units 13 on the interposer 10 (FIG. 1). In the present invention, the interposer 10 may mate and unmate with the electrical interfaces 11 through hundreds of cycles as will be described.

Figure 2:
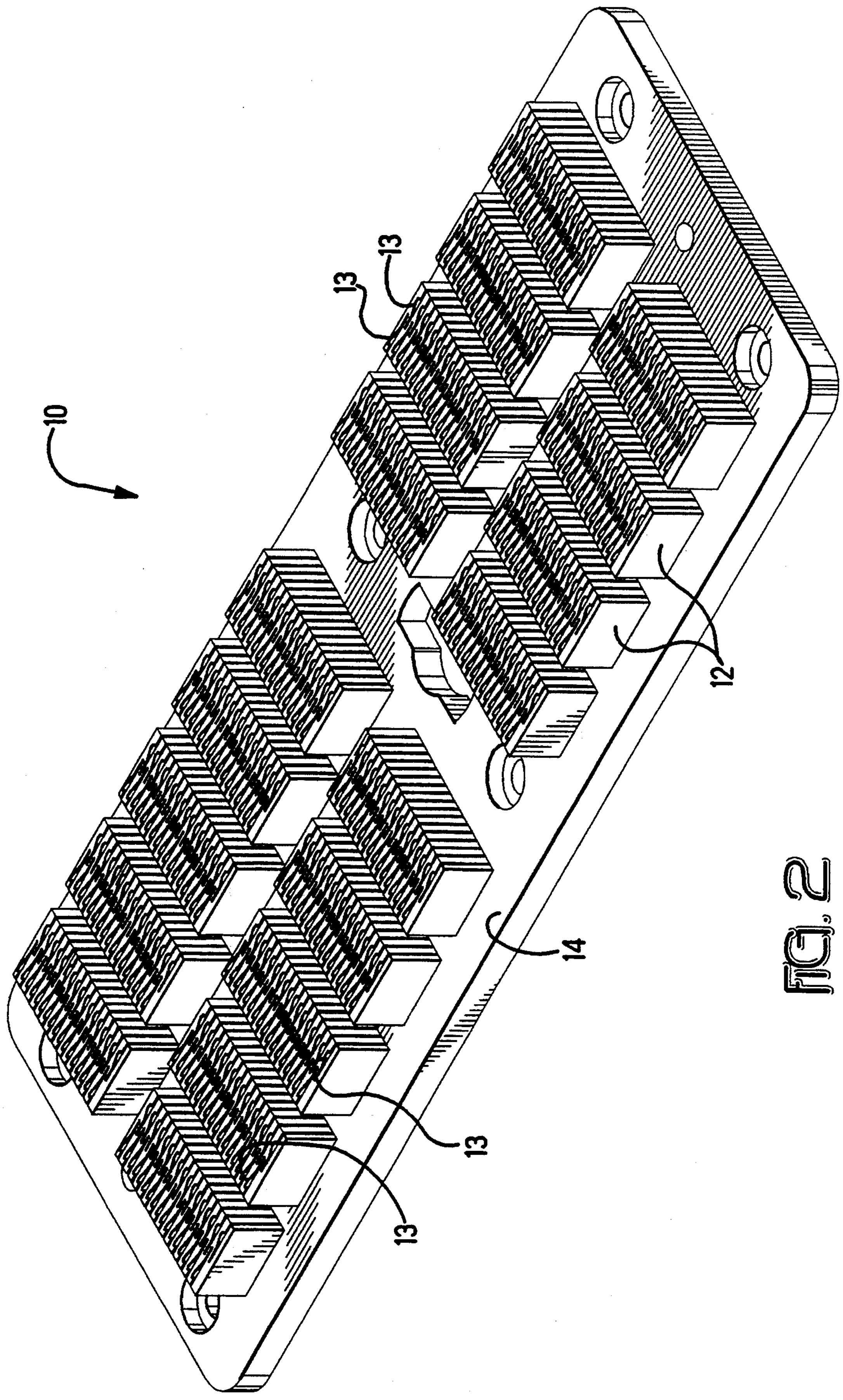
FIG. 2 is a perspective view of a nest of interposers of the present invention.
Figure 3:
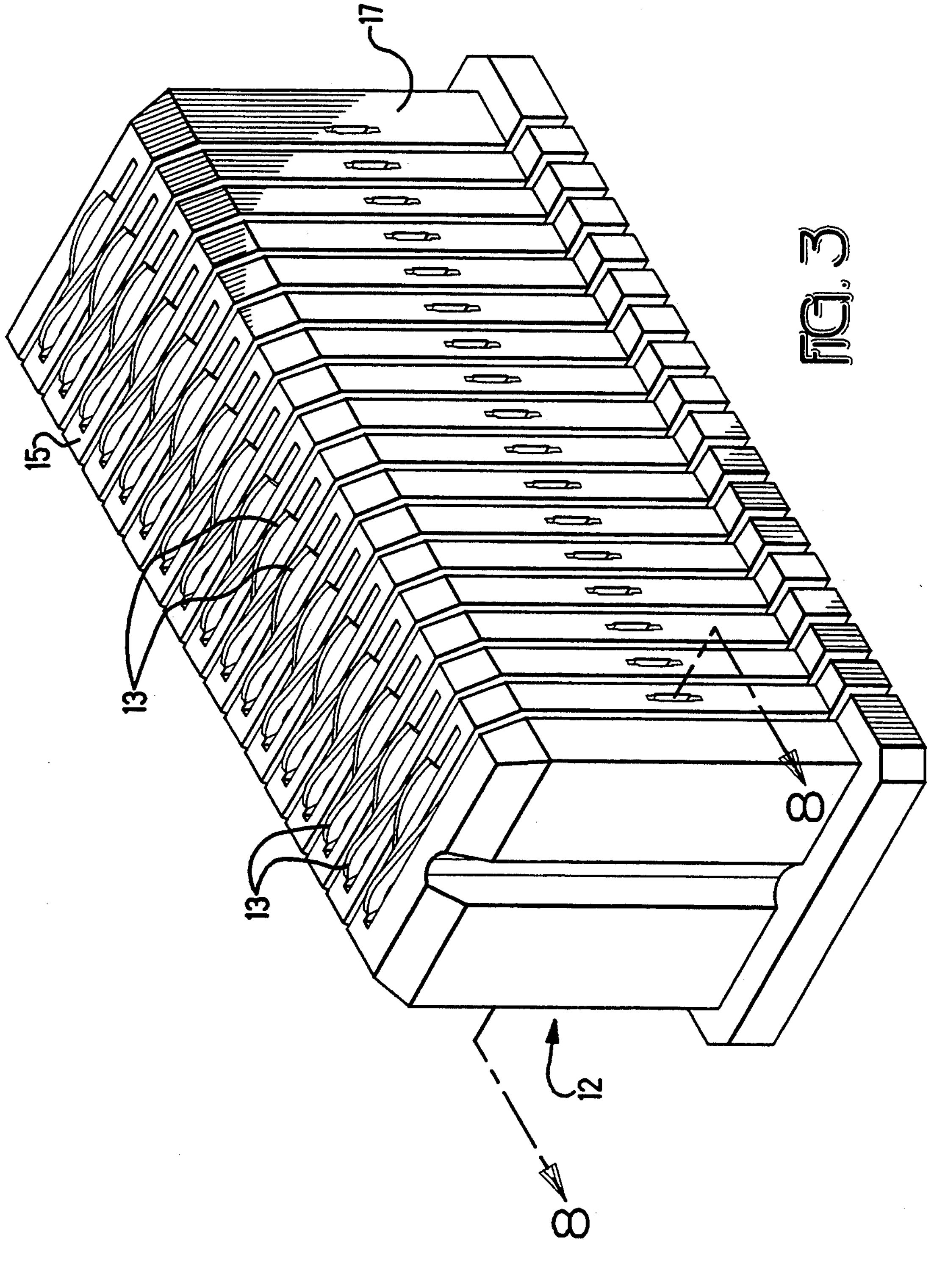
FIG. 3 is a perspective view showing a plurality of electrical contact units received in both sides of the contact module.
Figure 4:
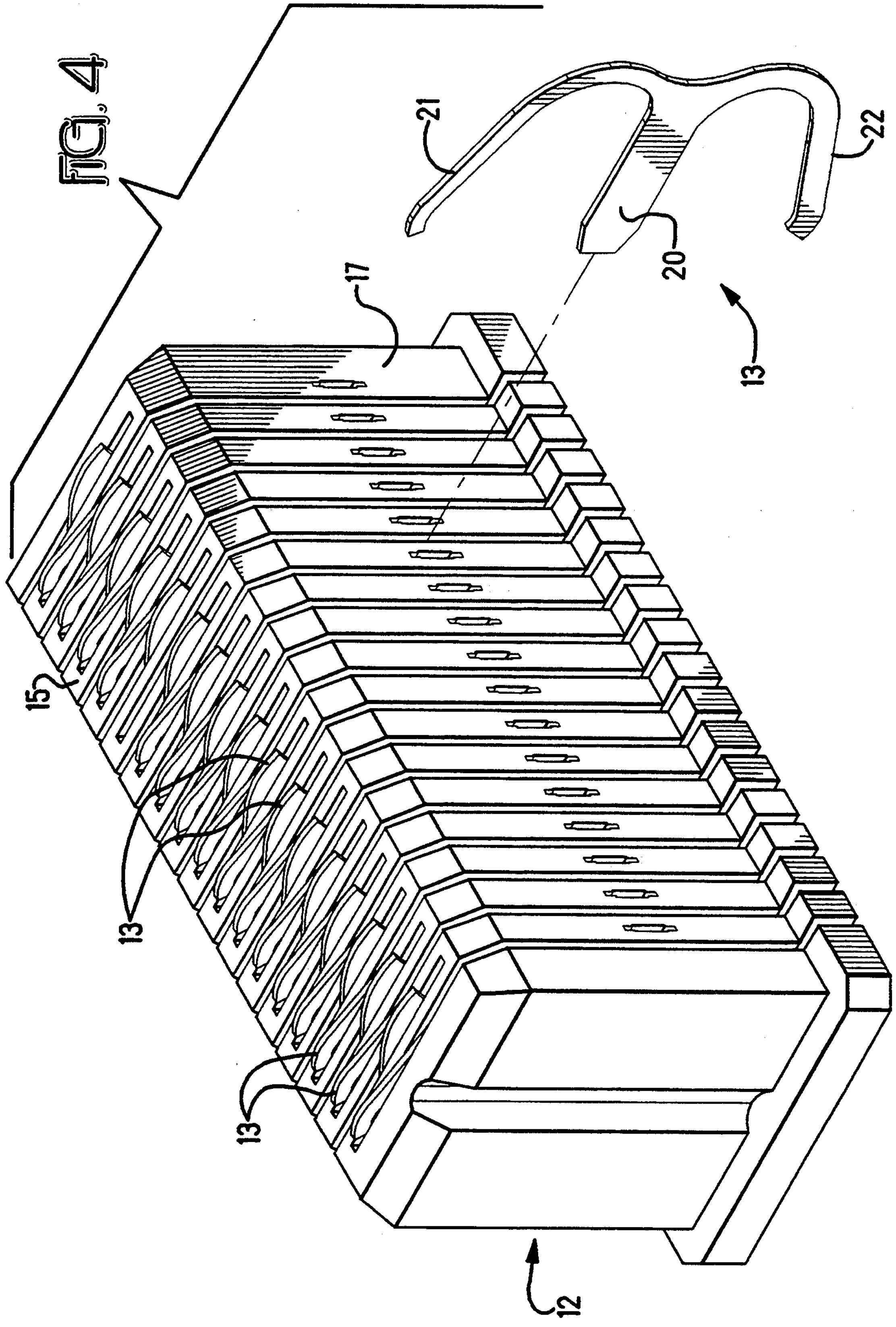
FIG. 4 is a perspective view showing the insertion of an electrical contact unit into the contact module.

The interposer 10 is a contact module 12 having a plurality of electrical contact units 13 inserted therein. A nest of contact modules 12 on a support 14 are disposed between the compliant electrical interfaces 11 (FIG. 2). It is preferred that the contact module 12 be formed of a non-conducting material and have a top 15, a bottom 16, a first side 17 and an opposite second side 18. The electrical contact units 13 are inserted into the contact module 12 preferably from both sides 17, 18 thereof for economy of space and to provide a maximum number of electrical contact units 13 for each contact module 12. In a particularly preferred embodiment the electrical contact units 13 are inserted on staggered 0.020 inch centerlines (FIGS. 3, 4). The insertion and retention of the electrical contact units 13 in the contact module 12 will be discussed. A portion of each electrical contact unit 13 extends outwardly from the top 15 and the bottom 16 of the contact module 12 to form the electrical connection with the electrical interfaces 11.

The interposer 10 of the present invention has electrical contact units 13 as epsilon-shaped units with a center leg 20. A first beam 21 and a second beam 22 are each connected to the center leg 20. Further, each beam 21, 22 has a respective end 23, 24 distal from the center leg 20. The respective ends 23, 24 of the beams 21, 22 are the points of contact between the interposer 10 and the electrical interfaces 11. It is preferred that each end 23, 24 have an arcuate portion 25, 26 formed thereon. The center leg 20 has an end 27 distal from the connection with the beams 21, 22. Preferably, said end 27 is tapered to be narrower than the leg 20.

The epsilon-shaped unit 13 is formed from a material which, for rapid and economical production, may be stamped from a sheet of material having uniform thickness of approximately 0.006 inches. The material resists plastic deformation to enable the unit to withstand hundreds of mating/unmating cycles. It is preferred that the electrical contact unit 13 be formed from spring-tempered beryllium copper, however other conductive metals known to persons skilled in the art may be used.

The material of the electrical contact unit 13 and the epsilon-shaped configuration provide resiliency to the beams 21, 22 so that when the interposer 10 containing the electrical contact unit 13 is mated with the electrical interfaces 11, the respective beams 21, 22 are urged toward the center leg 20 on the electrical contact unit 13. The ends 23, 24 of each beam are each displaced by approximately 0.020 inches. This displacement provides a wiping motion of the respective ends 23, 24 of the beams 21, 22 across the pads of the electrical interfaces 11. A minimum of 0.010 inches of wipe is produced such that an excellent electrical connection is provided.

It is preferred that the arcuate portions 25, 26 of the respective beams 21, 22 be coated or plated with a metal. Depending upon the particular application, the metal plating may be selected as desired but it is preferred that the end 23 of the first beam 21 be gold coated, the end 24 of the second beam 22 be coated with a tin alloy such as tin-lead. These coatings are commonly used in the electronics industry and conform to present requirements.

Figure 5:
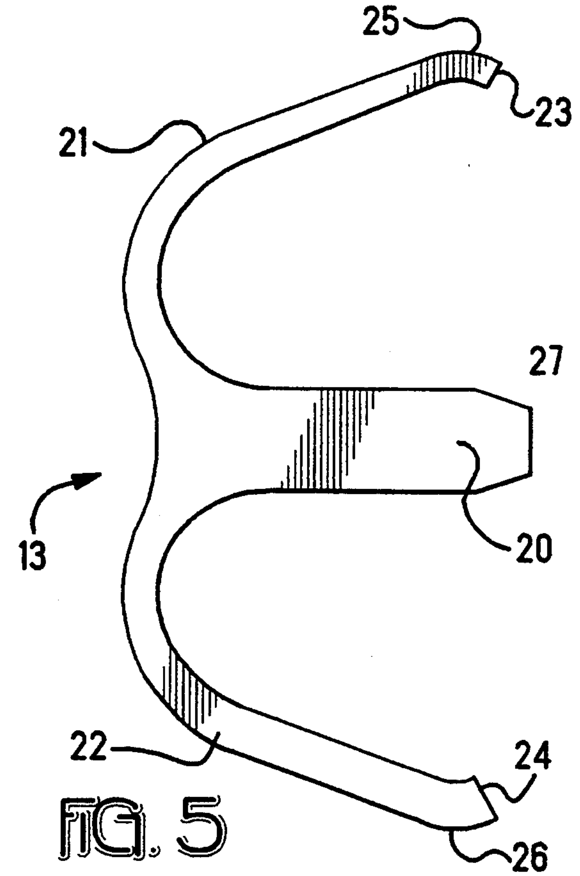
FIG. 5 is a side plan view of the electrical contact unit of the present invention.
Figure 6:
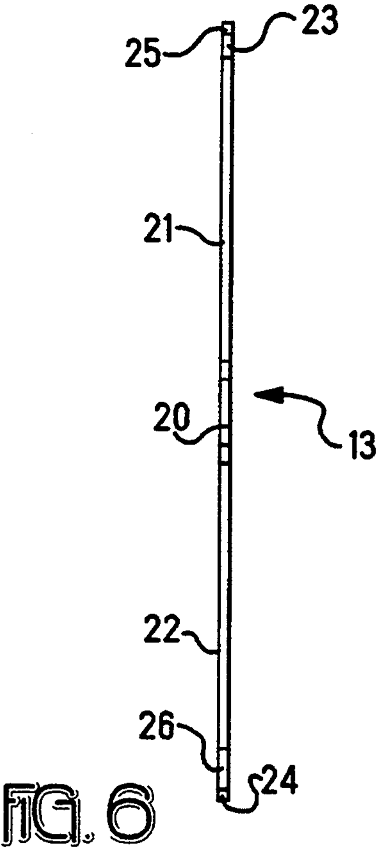
FIG. 6 is an end view of FIG. 5.

It is further preferred that the beams 21, 22 have different widths. The first beam 21 has a width of approximately 0.018 inches which provides a normal force of approximately 100 g. This force is typical for use with gold coated contacts and provides a good electrical connection between the beam 21 and the electrical interface 11. The second beam has a width of approximately 0.024 inches which provides a normal force of 200 g. This force is typical for use with tin-lead coated contacts and provides a good electrical connection between the beam 22 and the electrical interface 11 (FIGS. 5, 6).

Figure 7:
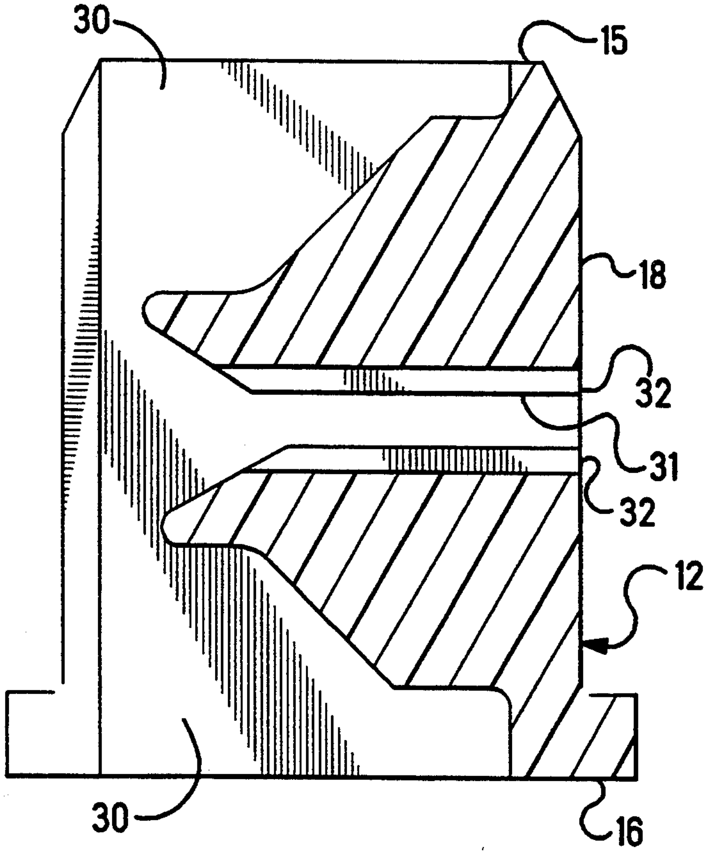
FIG. 7 is a cross-sectional view taken across the lines 7—7 of FIG. 4.
Figure 8:
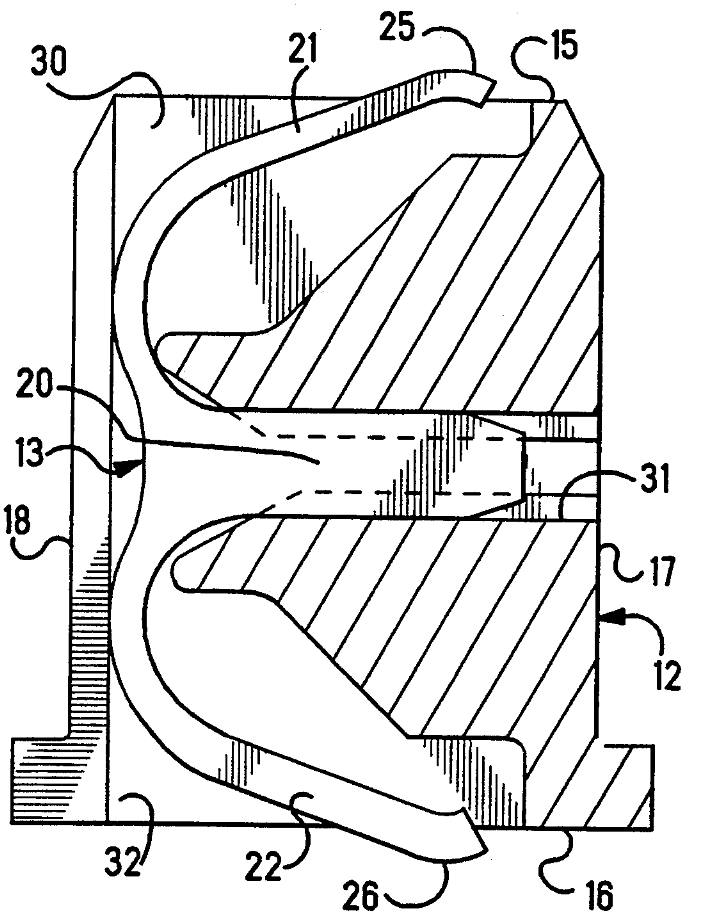
FIG. 8 is a cross-sectional view taken across the lines 8—8 of FIG. 3.
Figure 9:
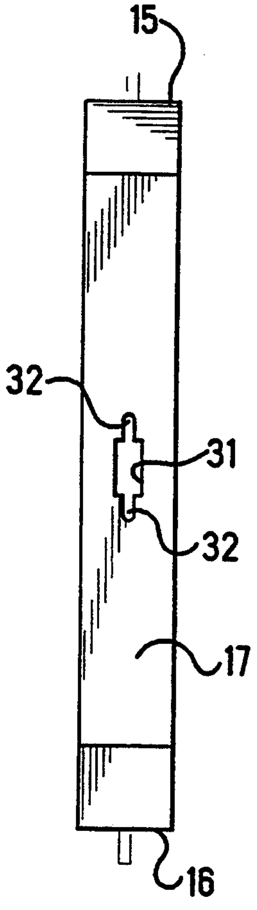
FIG. 9 is an end view of FIG. 7 showing the leg of the electrical contact unit received in the contact module in an interference fit.

The contact module 12 has a plurality of spaced-apart retention openings 30 formed on both sides 17, 18 of the module 12 (FIGS. 7, 8). The plurality of electrical contact units 13 are individually inserted in a respective retention opening 30. Each respective retention opening 30 has a portion which communicates with the top 15 of the contact module 12 and with the bottom 16 of the contact module 12 such that when the electrical contact unit 13 is received in the respective retention opening 30, the arcuate portion 25 of the first beam 23 extends outwardly above the top 15 of the contact module 12 and the arcuate portion 26 of the second beam 24 extends outwardly below the bottom 16 of the contact module 12. Further, each retention opening 30 has a center portion 31 in which the center leg 20 of each respective electrical contact unit 13, is received. The tapered end 27 of the center leg 20 of the electrical contact unit 13 is initially received in the center portion 31 to guide the insertion of the electrical contact unit 13. The center leg 20 of the electrical contact unit 13 is retained in the center portion 31 of the retention opening 30 by an interference fit. The interference fit restricts lateral and vertical movement of the beams 21, 22 during mating and unmating of the interposer 10 with the electrical interfaces 11. The interference fit and the configuration of the retention opening 30 also accurately positions the electrical contact units 13 within the contact module 12. In a preferred embodiment (FIG. 9), the center portion 31 of the retention opening 30 is a profiled slot having diametrically opposed segments 32 in which the center arm 20 of the electrical contact unit 13 is received. The segments 32 have a width which is less than the width of the center portion 31 of the retention opening 30. The width of each segment is approximately the same as the thickness of the electrical contact unit 13.

The epsilon shape of the electrical contact unit 13, the configuration of the retention openings 30 and the interference fit of the center leg 20 in the center portion 31 of the retention opening 30 are compatible with the automatic insertion of the electrical contact units 13 into the contact module 12. In this manner, the interposer 10 of the present invention is rapidly and inexpensively assembled and provides a significant improvement over the prior art.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. An electrical contact for mating/unmating with electrical interfaces comprising:

an epsilon-shaped unit having a center leg, a first beam and a second beam, said beams being connected to said center leg at a point, wherein each said beam and said center leg follows a path of continuously increasing distance from said point and from each other, each said beam having an end distal from said point, wherein electrical contact with respective electrical interfaces is made.

2. The electrical contact of claim 1, wherein said beams of said epsilon-shaped unit have a resiliency wherein, a wiping movement is produced that is perpendicular to and responsive to a normal force applied to said distal ends of said beams.

3. The electrical contact of claim 2, wherein the minimum wiping movement is 0.010 inches.

4. An interposer connector comprising: a contact module and the electrical contact of claim 1, wherein said epsilon-shaped unit has a center leg distal end, and said contact module has a retention opening therein, wherein said center leg is slidingly received within said retention opening in a vector direction defined by said point and moving toward said center leg distal end and is retained within said retention opening by an interference fit.

5. The interposer connector of claim 4, wherein the respective beams have a resiliency wherein, when the electrical contact mates with the electrical interface, the ends of the respective beams are urged toward the center leg and each end is displaced by approximately 0.020 inches.

6. The interposer connector of claim 4, wherein each said beam has a respective width, the width of said first beam being less than the width of said second beam.

7. The interposer connector of claim 4, wherein said contact module has a first side and a second opposing side, each said side having a plurality of spaced-apart retention openings, each said opening receiving a single epsilon-shaped unit.

8. The interposer connector of claim 4, wherein each said beam has a resiliency wherein, a wiping movement is produced that is perpendicular to a normal force applied to said ends of said beams.

9. The combination of claim 8, wherein the minimum wiping movement is 0.010 inches.

10. The electrical contact of claim 1, wherein each beam has a respective width, the width of the first beam being less than the width of the second beam.

11. The interposer connector of claim 10, wherein the width of said first beam is approximately 0.018 inches and the width of said second beam is approximately 0.024 inches.

12. The interposer connector of claim 7, wherein said retention openings are unidirectional and alternatingly disposed on said first and second sides.

13. The interposer connector of claim 12, wherein said retention openings are disposed on 0.010 inch centerlines.

* * * * *